US010910547B2

United States Patent
Nishihara et al.

(10) Patent No.: US 10,910,547 B2
(45) Date of Patent: Feb. 2, 2021

(54) PIEZOELECTRIC THIN FILM RESONATOR, FILTER, AND MULTIPLEXER

(71) Applicant: TAIYO YUDEN CO., LTD., Tokyo (JP)

(72) Inventors: Tokihiro Nishihara, Tokyo (JP); Jiansong Liu, Tokyo (JP); Tsuyoshi Yokoyama, Tokyo (JP); Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 560 days.

(21) Appl. No.: 15/835,057

(22) Filed: Dec. 7, 2017

(65) Prior Publication Data

US 2018/0175275 A1 Jun. 21, 2018

(30) Foreign Application Priority Data

Dec. 21, 2016 (JP) .................... 2016-248347

(51) Int. Cl.
*H01L 41/47* (2013.01)
*H03H 9/17* (2006.01)
(Continued)

(52) U.S. Cl.
CPC ........ *H01L 41/047* (2013.01); *H01L 41/0805* (2013.01); *H03H 9/02118* (2013.01);
(Continued)

(58) Field of Classification Search
CPC .... H03H 9/02118; H03H 9/173; H03H 9/175; H03H 9/54; H03H 9/587; H03H 9/605;
(Continued)

(56) References Cited

U.S. PATENT DOCUMENTS

| 9,356,573 B2 * | 5/2016 | Yokoyama | ............ H01L 41/18 |
| 10,263,598 B2 * | 4/2019 | Shin | ............ H03H 9/173 |

(Continued)

FOREIGN PATENT DOCUMENTS

| JP | 2010045437 A | * | 2/2010 | ............ H03H 9/13 |
| JP | 2015-95729 A | | 5/2015 | |

OTHER PUBLICATIONS

Japanese Office Action dated Jan. 15, 2019, in a counterpart Japanese patent application No. 2016-248347. (A machine translation (not reviewed for accuracy) attached.).

*Primary Examiner* — J. San Martin
(74) *Attorney, Agent, or Firm* — Chen Yoshimura LLP

(57) ABSTRACT

A piezoelectric thin film resonator includes: a piezoelectric film located on a substrate; lower and upper electrodes facing each other across a part of the piezoelectric film; and an insertion film located between the lower and upper electrodes, located in a part of an outer peripheral region within a resonance region where the lower and upper electrodes face each other across the piezoelectric film, and not located in a center region of the resonance region, a first width in the resonance region of the insertion film in a first region, where the upper electrode is extracted from the resonance region, being greater than a third width in the resonance region in a third region other than a second region, where the lower electrode is extracted from the resonance region, and the first region, a second width in the resonance region in a second region being the third width or greater.

14 Claims, 12 Drawing Sheets

(51) Int. Cl.
*H01L 41/047* (2006.01)
*H01L 41/08* (2006.01)
*H03H 9/54* (2006.01)
*H03H 9/58* (2006.01)
*H03H 9/02* (2006.01)
*H03H 9/60* (2006.01)
*H03H 9/70* (2006.01)

(52) U.S. Cl.
CPC ............ *H03H 9/173* (2013.01); *H03H 9/175* (2013.01); *H03H 9/54* (2013.01); *H03H 9/587* (2013.01); *H03H 9/605* (2013.01); *H03H 9/706* (2013.01)

(58) Field of Classification Search
CPC ... H03H 9/706; H01L 41/0805; H01L 41/047; H01L 41/08
See application file for complete search history.

(56) References Cited

U.S. PATENT DOCUMENTS

| | | | |
|---|---|---|---|
| 2006/0119230 A1* | 6/2006 | Umeda | H03H 9/172 310/358 |
| 2007/0278899 A1* | 12/2007 | Fujii | H03H 9/173 310/324 |
| 2008/0042780 A1* | 2/2008 | Lee | H03H 9/02118 333/187 |
| 2014/0203686 A1* | 7/2014 | Song | H01L 41/314 310/326 |
| 2015/0130559 A1 | 5/2015 | Yokoyama et al. | |
| 2016/0204761 A1* | 7/2016 | Lee | H03H 3/02 333/187 |

* cited by examiner

PIEZOELECTRIC THIN FILM RESONATOR, FILTER, AND MULTIPLEXER

CROSS-REFERENCE TO RELATED APPLICATION

This application is based upon and claims the benefit of priority of the prior Japanese Patent Application No. 2016-248347, filed on Dec. 21, 2016, the entire contents of which are incorporated herein by reference.

FIELD

A certain aspect of the present invention relates to a piezoelectric thin film resonator, a filter, and a multiplexer.

BACKGROUND

Acoustic wave devices using piezoelectric thin film resonators have been used as filters and duplexers of wireless devices such as, for example, mobile phones. The piezoelectric thin film resonator has a structure designed to have a lower electrode and an upper electrode facing each other across a piezoelectric film.

Rapid diffusion of wireless systems has promoted the use of many frequency bands. This results in the strong demand for steepening the skirt characteristics of the filter and the duplexer. One way of steepening the skirt characteristics is to increase the Q-value of the piezoelectric thin film resonator. One of the causes that deteriorate the Q-value of the piezoelectric thin film resonator is leak of the acoustic wave energy from the resonance region to the outside.

However, the structure disclosed in Japanese Patent Application Publication No. 2015-95729 does not sufficiently reduce the acoustic wave energy leaking from the resonance region to the outside. Therefore, the degree of improvement in the Q-value is insufficient.

SUMMARY OF THE INVENTION

According to a first aspect of the present invention, there is provided a piezoelectric thin film resonator including: a substrate; a piezoelectric film located on the substrate; a lower electrode and an upper electrode facing each other across at least a part of the piezoelectric film; and an insertion film that is located between the lower electrode and the upper electrode, is located in at least a part of an outer peripheral region within a resonance region where the lower electrode and the upper electrode face each other across the piezoelectric film, and is not located in a center region of the resonance region, a first width in the resonance region of the insertion film in a first region being greater than a third width in the resonance region in a third region, a second width in the resonance region in a second region being equal to or greater than the third width, the upper electrode being extracted from the resonance region in the first region, the third region being a region other than the second region and the first region, the lower electrode being extracted from the resonance region in the second region.

According to a second aspect of the present invention, there is provided a filter including the above piezoelectric thin film resonator.

According to a third aspect of the present invention, there is provided a multiplexer including the above filter.

DETAILED DESCRIPTION

Hereinafter, a description will be given of embodiments of the present invention with reference to the accompanying drawings.

First Embodiment

Figure 1A:
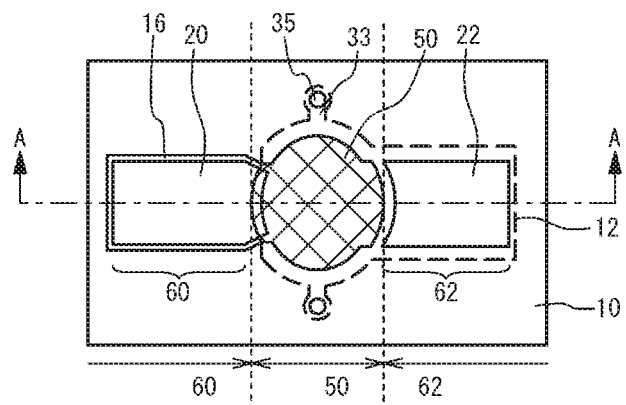
FIG. 1A is a plan view of a piezoelectric thin film resonator in accordance with a first embodiment.
Figure 1B:
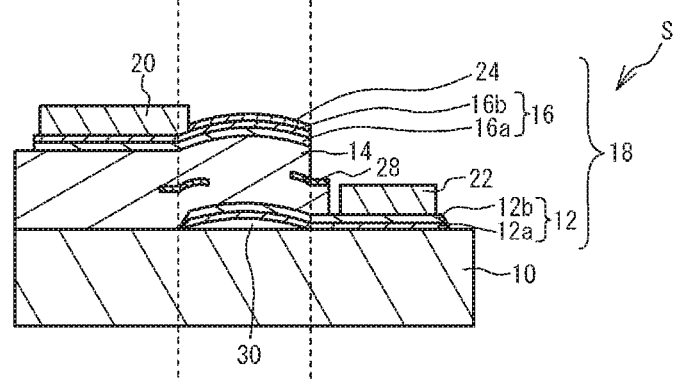
FIG. 1B and FIG. 1C are cross-sectional views taken along line A-A in FIG. 1A.
Figure 1C:
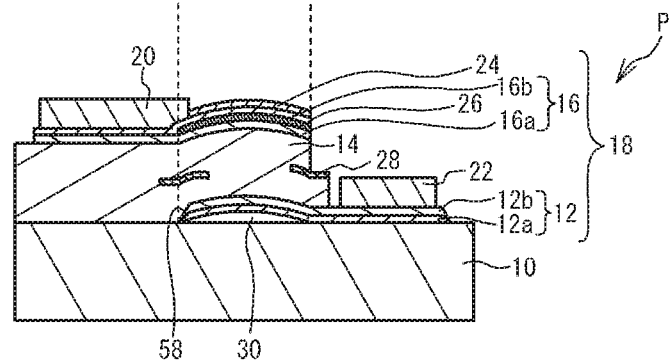

FIG. 1A is a plan view of a piezoelectric thin film resonator in accordance with a first embodiment, and FIG. 1B and FIG. 1C are cross-sectional views taken along line A-A in FIG. 1A. FIG. 1B is a cross-sectional view of, for example, a series resonator of a ladder-type filter, and FIG. 1C is a cross-sectional view of, for example, a parallel resonator of the ladder-type filter.

With reference to FIG. 1A and FIG. 1B, the structure of a series resonator S will be described. A lower electrode 12 is located on a substrate 10 that is a silicon (Si) substrate. An air gap 30 having a dome-shaped bulge is formed between the flat principal surface of the substrate 10 and the lower electrode 12. The dome-shaped bulge is a bulge having a shape in which the height of the air gap 30 is low in the periphery of the air gap 30 and increases at closer distances to the center of the air gap 30, for example. The lower electrode 12 includes a lower layer 12a and an upper layer 12b. The lower layer 12a is, for example, a chrome (Cr) film, while the upper layer 12b is, for example, a ruthenium (Ru) film.

Located on the lower electrode 12 is a piezoelectric film 14 mainly composed of aluminum nitride (AlN) having the main axis in the (002) direction. An insertion film 28 is located in the piezoelectric film 14. The insertion film 28 is located substantially in the middle in the film thickness direction of the piezoelectric film 14. The insertion film 28 may not be necessarily located in the middle in the film thickness direction, but when located in the middle, the insertion film 28 fulfills the function as the insertion film more. An upper electrode 16 is located on the piezoelectric film 14 so as to have a region (a resonance region 50) in which the upper electrode 16 faces the lower electrode 12 across the piezoelectric film 14. The resonance region 50 is a region in which the acoustic wave in the thickness extension mode excites. The upper electrode 16 includes a lower layer 16a and an upper layer 16b. The lower layer 16a is, for example, a Ru film, while the upper layer 16b is, for example, a Cr film.

A silicon oxide film as a frequency adjusting film 24 is formed on the upper electrode 16. A multilayered film 18 in the resonance region 50 includes the lower electrode 12, the piezoelectric film 14, the insertion film 28, the upper electrode 16, and the frequency adjusting film 24. The frequency adjusting film 24 may function as a passivation film.

A region where the lower electrode 12 is extracted from the resonance region 50 is an extraction region 62, and a region where the upper electrode 16 is extracted from the resonance region 50 is an extraction region 60. Additional films 20 and 22 are respectively located in the extraction region 60 and the extraction region 62. The additional films 20 and 22 are made of, for example, a titanium (Ti) film and a gold (Au) film stacked in this order from the lower side. The additional films 20 and 22 function as wiring lines connecting between the piezoelectric thin film resonators and/or an underlayer for bumps. When the additional films 20 and 22 are located to the vicinity of the resonance region 50, the electric resistances of the extraction regions 60 and 62 are reduced. Accordingly, the loss of the piezoelectric thin film resonator is reduced.

As illustrated in FIG. 1A, an introduction path 33 for etching a sacrifice layer is formed in the lower electrode 12. The sacrifice layer is a layer for forming the air gap 30. The vicinity of the tip of the introduction path 33 is not covered with the piezoelectric film 14, and the lower electrode 12 has holes 35 at the ends of the introduction path 33.

With reference to FIG. 1A and FIG. 1C, a structure of a parallel resonator P is described. The parallel resonator P is different from the series resonator S in that a mass load film 26 is located between the lower layer 16a and the upper layer 16b of the upper electrode 16. The mass load film 26 is, for example, a Ti (titanium) film. Thus, the multilayered film 18 includes the mass load film 26 formed across the entire face in the resonance region 50 in addition to the multilayered film of the series resonator S. Other structures are the same as those of the series resonator S illustrated in FIG. 1B, and the description thereof is thus omitted.

The difference in resonant frequency between the series resonator S and the parallel resonator P is adjusted with use of the film thickness of the mass load film 26. The resonant frequency of each of the series resonator S and the parallel resonator P is adjusted by adjusting the film thickness of the corresponding frequency adjusting film 24.

When the piezoelectric thin film resonator has a resonant frequency of 2 GHz, the lower layer 12a of the lower electrode 12 is formed of a Cr film with a film thickness of 100 nm, and the upper layer 12b of the lower electrode 12 is formed of a Ru film with a film thickness of 250 nm. The piezoelectric film 14 is an AlN film with a film thickness of 1100 nm. The insertion film 28 is a silicon oxide ($SiO_2$) film with a film thickness of 150 nm. The lower layer 16a of the upper electrode 16 is a Ru film with a film thickness of 250 nm, and the upper layer 16b of the upper electrode 16 is a Cr film with a film thickness of 50 nm. The frequency adjusting film 24 is a silicon oxide film with a film thickness of 50 nm. The mass load film 26 is a Ti film with a film thickness of 120 nm. The film thickness of each layer is appropriately set to achieve desired resonance characteristics.

The substrate 10 may be a sapphire substrate, a spinel substrate, an alumina substrate, a quartz substrate, a glass substrate, a ceramic substrate, or a GaAs substrate instead of a Si substrate. The lower electrode 12 and the upper electrode 16 may be formed of a single-layer film of aluminum (Al), Ti, copper (Cu), molybdenum (Mo), tungsten (W), tantalum (Ta), platinum (Pt), rhodium (Rh), or iridium (Jr) or a multilayered film of at least two of them instead of Ru and Cr. For example, the lower layer 16a of the upper electrode 16 may be made of Ru, and the upper layer 16b of the upper electrode 16 may be made of Mo.

The piezoelectric film 14 may be made of zinc oxide (ZnO), lead zirconate titanate (PZT), or lead titanate (Pb-$TiO_3$) instead of aluminum nitride. Alternatively, for example, the piezoelectric film 14 may be mainly composed of aluminum nitride, and may contain other elements for improving the resonance characteristic or the piezoelectricity. For example, the use of scandium (Sc), a Group II element and a Group IV element, or a Group II element and a Group V element as additive elements improves the piezoelectricity of the piezoelectric film 14. Thus, the effective electromechanical coupling coefficient of the piezoelectric thin film resonator is improved. The Group II element is, for example, calcium (Ca), magnesium (Mg), strontium (Sr), or zinc (Zn). The Group IV element is, for example, Ti, zirconium (Zr), or hafnium (Hf). The Group V element is, for example, Ta, niobium (Nb), or vanadium (V). Furthermore, the piezoelectric film 14 may be mainly composed of aluminum nitride and contain boron (B).

The frequency adjusting film 24 may be a silicon nitride film or an aluminum nitride film instead of a silicon oxide film. The mass load film 26 may be a single-layer film of Ru, Cr, Al, Cu, Mo, W, Ta, Pt, Rh, or Jr instead of Ti. Alternatively, an insulating film made of, for example, metal nitride such as silicon nitride or metal oxide such as silicon oxide may be used. The mass load film 26 may be formed below the lower electrode 12, between the layers of the lower electrode 12, on the upper electrode 16, between the lower electrode 12 and the piezoelectric film 14, or between the piezoelectric film 14 and the upper electrode 16 instead of between the layers (the lower layer 16a and the upper layer 16b) of the upper electrode 16. The mass load film 26 may be larger than the resonance region 50 as long as the mass load film 26 is formed so as to include the resonance region 50.

Figure 2:
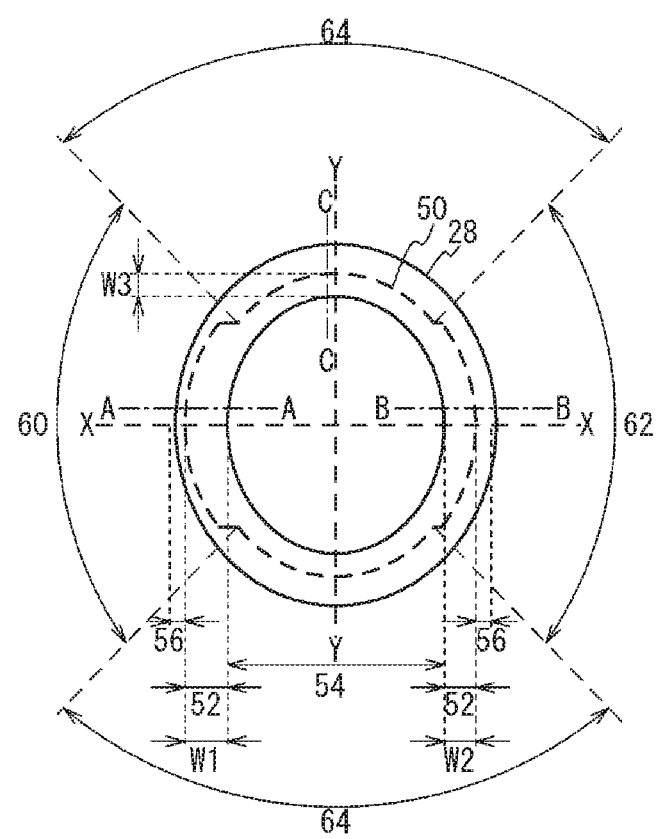
FIG. 2 is a plan view illustrating a resonance region and an insertion film in the first embodiment.

FIG. 2 is a plan view illustrating a resonance region and an insertion film in a first embodiment. As illustrated in FIG. 2, the insertion film 28 is located in an outer peripheral region 52 within the resonance region 50, but is not located in a center region 54. The outer peripheral region 52 is a region that is located within the resonance region 50, includes the outer periphery of the resonance region 50, and is located along the outer periphery. The outer peripheral region 52 has, for example, a ring shape or a partly-cut ring shape. The center region 54 is a region that is located within the resonance region 50 and includes the center of the resonance region 50. The center may not be necessarily the geometric center. The insertion film 28 is located in the outer peripheral region 52 and a region 56 surrounding the resonance region 50. The insertion film 28 is continuously located from the outer peripheral region 52 to the outside of the resonance region 50.

Young's modulus of the insertion film 28 is preferably less than the piezoelectric film 14. Since Young's modulus correlates with the acoustic impedance when the densities are approximately the same, the acoustic impedance of the insertion film 28 is preferably less than that of the piezoelectric film 14. This configuration improves the Q-value. Additionally, when the insertion film 28 is a metal film, the effective electromechanical coupling coefficient is improved. Furthermore, to make the acoustic impedance of the insertion film 28 less than that of the piezoelectric film 14, when the piezoelectric film 14 is mainly composed of aluminum nitride, the insertion film 28 is preferably an Al film, an Au film, a Cu film, a Ti film, a Pt film, a Ta film, a Cr film, or a silicon oxide film. Especially for Young's modulus, the insertion film 28 is preferably an Al film or a silicon oxide film.

A region other than the extraction regions 60 and 62 in the region surrounding the resonance region 50 is referred to as a region 64. The resonance region 50 basically has an elliptical shape, and extends outward in the extraction region 60 and the extraction region 62 with respect to the region 64. Furthermore, the resonance region 50 extends outward in the extraction region 60 more than in the extraction region 62. The insertion film 28 has a ring shape having a uniform width. When the insertion widths of the insertion film 28 in the resonance region 50 in the extraction regions 60 and 62 and the region 64 are respectively represented by W1, W2, and W3, W1>W2>W3. In the extraction regions 60 and 62 and the region 64, each of the insertion widths W1, W2, and W3 is substantially uniform.

In the first embodiment, the insertion film 28 is configured to have a 180 degrees rotationally symmetric planar shape, and a part of the lower electrode 12 and a part of the upper electrode 16 are offset. For example, in the extraction regions 60 and 62, the outer periphery of the resonance region 50 is offset outward. This structure allows the insertion widths W1 through W3 to differ from each other while each of the insertion widths W1 through W3 respectively in the regions 60, 62, and 64 is substantially uniform.

Figure 3A:
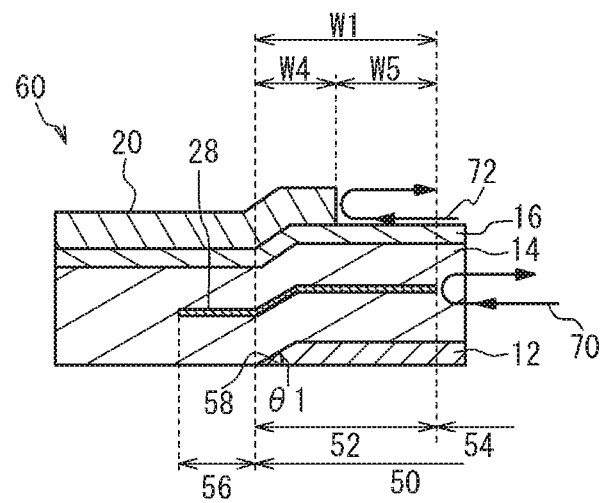
FIG. 3A through FIG. 3C are cross-sectional views taken along line A-A, line B-B, and line C-C in FIG. 2, respectively.
Figure 3B:
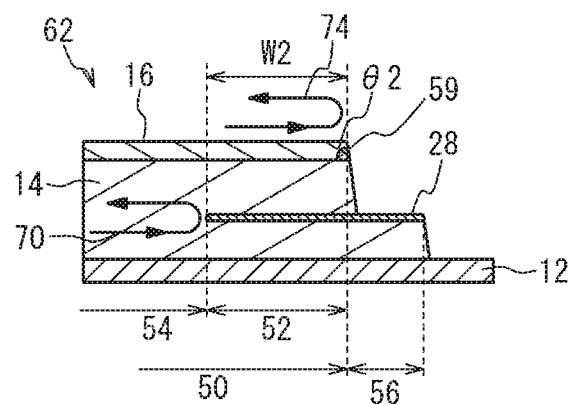
Figure 3C:
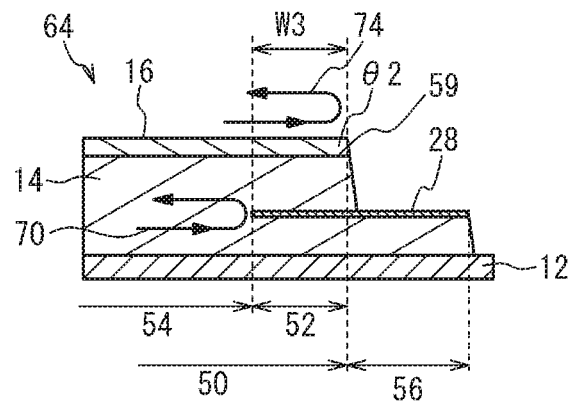

FIG. 3A through FIG. 3C are cross-sectional views taken along line A-A, line B-B, and line C-C in FIG. 2, respectively. In FIG. 3A through FIG. 3C, the illustration of the substrate 10 and the air gap 30 is omitted. As illustrated in FIG. 3A, in the extraction region 60, an end face 58 of the lower electrode 12 has a tapered shape so that the angle $\theta1$ between the end face 58 and the lower surface of the lower electrode 12 is an acute angle. This is because the film quality of the piezoelectric film 14 on the end face 58 deteriorates when the angle $\theta1$ is 90° or greater and the piezoelectric film 14 is formed on the lower electrode 12 and the substrate 10. To prevent the deterioration of the film quality of the piezoelectric film 14, the angle $\theta1$ is preferably made to be, for example, 60° or less. The end face 58 may not necessarily have a flat surface. Even in a region where the lower electrode 12 is thin, the acoustic wave vibrates. Thus, the region to the tip, including the end face 58, of the lower electrode 12 is defined as the resonance region 50.

Even when the angle $\theta1$ is made to be an acute angle, a crack starting from the tip of the lower electrode 12 may be formed in the piezoelectric film 14 and the upper electrode 16. Thus, the additional film 20 overlaps with the edge of the resonance region 50 in plan view. This structure reduces cracks, starting from the tip of the lower electrode 12, in the piezoelectric film 14 and the upper electrode 16. Additionally, even when a crack is formed in the upper electrode 16, the electrical disconnection is inhibited by the additional film 20. The width of the additional film 20 in the resonance region 50 is represented by W4. The width other than the additional film 20 of the insertion width W1 is represented by W5.

As illustrated in FIG. 3B, in the extraction region 62, an end face 59 of the upper electrode 16 is substantially perpendicular to the substrate 10. That is, the angle $\theta2$ between the end face 59 and the lower surface of the upper electrode 16 is approximately 90°. The angle $\theta2$ may be less than 90°. Even when the angle $\theta2$ of the end face 59 of the upper electrode 16 is large, it does not affect the film quality of the piezoelectric film 14. Thus, the angle $\theta2$ of the end face 59 of the upper electrode 16 is made to be large to allow the upper electrode 16 to be easily processed. Thus, the angle $\theta2$ is greater than the angle $\theta1$. As with the lower electrode 12, the region to the tip, including the end face 59, of the upper electrode 16 is defined as the resonance region 50.

As illustrated in FIG. 3C, in the region 64, the angle $\theta2$ of the end face 59 of the upper electrode 16 is approximately equal to the angle $\theta2$ in the extraction region 62.

Simulation of the First Embodiment

For the X-X cross-section and the Y-Y cross-section illustrated in FIG. 2, the Q-value at the antiresonant frequency was simulated by using a two-dimensional finite element method. The materials and the film thicknesses exemplified as the piezoelectric thin film resonator having a resonant frequency of 2 GHz were assumed as simulation conditions.

In the two-dimensional simulation of the X-X cross-section, the angle $\theta1$ was assumed to be 30°, the angle $\theta2$ was assumed to be 90°, the additional film 20 was assumed to be formed of a Ti film with a film thickness of 100 nm and an Au film with a film thickness of 300 nm stacked in this order from the lower side, and the width W4 was assumed to be 1.0 μm. The insertion widths W1 and W2 were varied.

Figure 4:
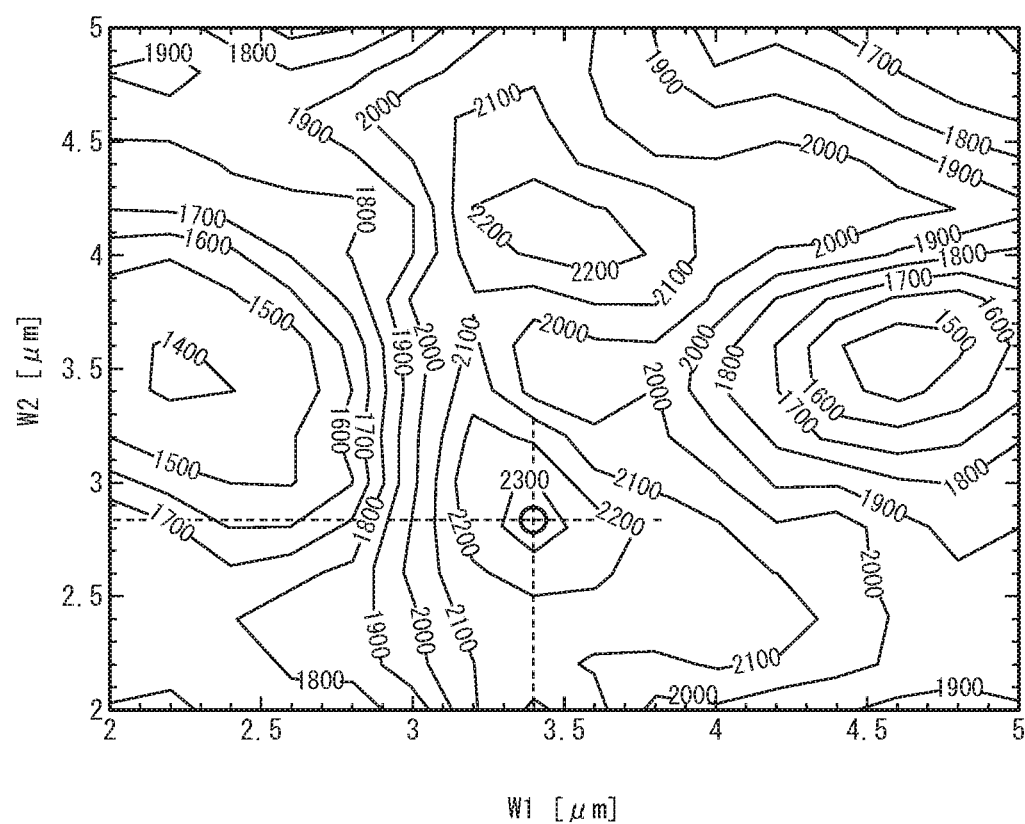
FIG. 4 illustrates a Q-value at an anti-resonant frequency with respect to insertion widths W1 and W2 in the first embodiment.

FIG. 4 illustrates the Q-value at the anti-resonant frequency with respect to the insertion widths W1 and W2 in the first embodiment. Lines in FIG. 4 indicate contour lines of the Q-value, and the value presented on each line is the Q-value. The point with the highest Q-value is indicated by an open circle. The same applies drawings hereinafter. The Q-value is the largest when the insertion width W1 is 3.4 μm and W2 is 2.8 μm. As presented, in the X-X cross-section, the dependence of the Q-value on the insertion width W1 in the extraction region 60 is asymmetric to the dependence of the Q-value on the insertion width W2 in the extraction region 62.

In the two-dimensional simulation of the Y-Y cross-section, the angle $\theta2$ was assumed to be 90°. The insertion widths W3 at both sides of the Y-Y cross-section were individually varied.

Figure 5:
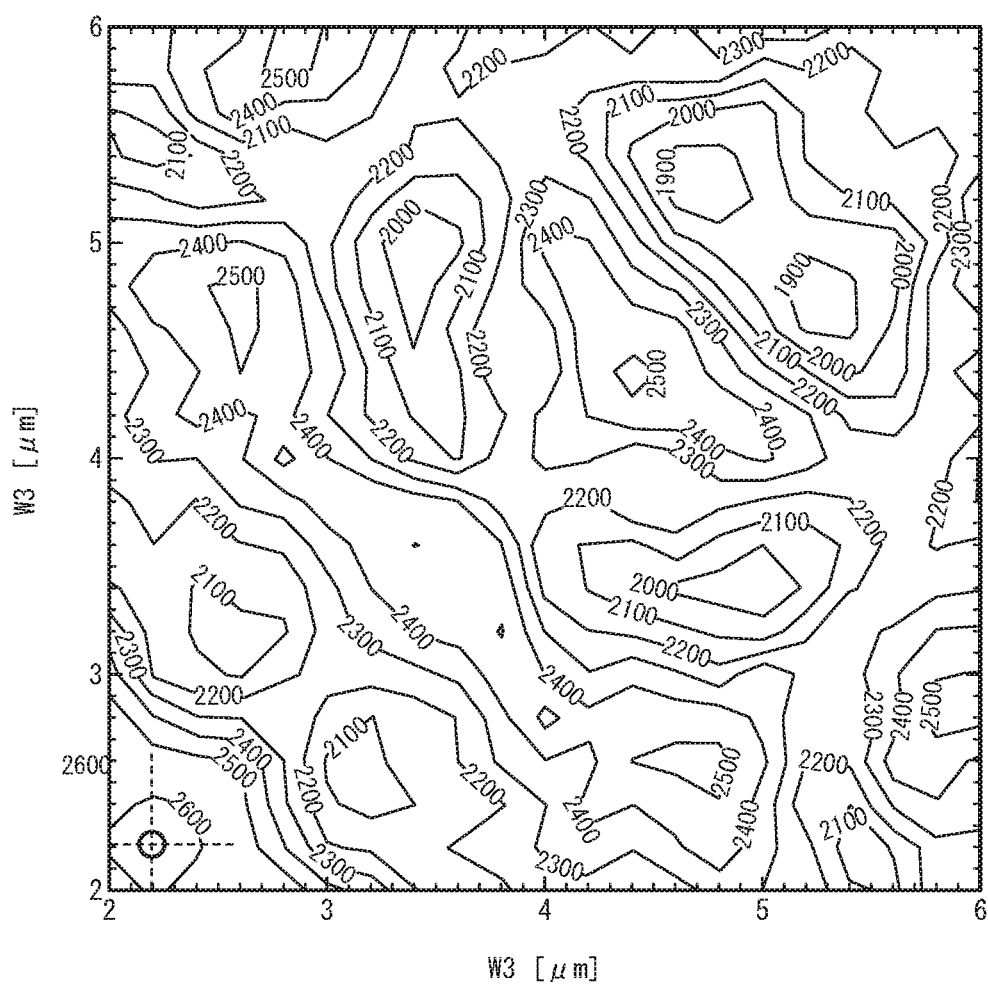
FIG. 5 illustrates the Q-value at the anti-resonant frequency with respect to the insertion width W3 in the first embodiment.

FIG. 5 illustrates the Q-value at the anti-resonant frequency with respect to the insertion widths W3 in the first embodiment. The horizontal axis and the vertical axis respectively represent the insertion width W3 at one end and the insertion width W3 at the other end in the Y-Y cross-section. As illustrated in FIG. 5, in the Y-Y cross-section, the dependence of the Q-value on the insertion width is line symmetric with respect to the line of W3=W3. When the insertion width W3 is 2.2 μm, the Q-value is the largest. As illustrated in FIG. 4 and FIG. 5, the optimum values of the insertion widths W1, W2, and W3 differ.

First Variation of the First Embodiment

Figure 6:
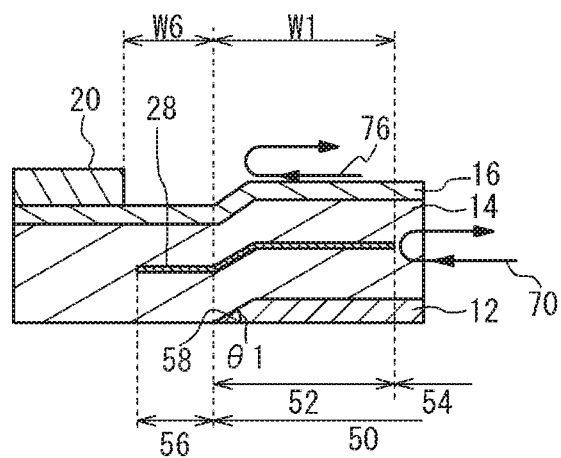
FIG. 6 is a cross-sectional view corresponding to the cross section taken along A-A in FIG. 2 in a first variation of the first embodiment.

The X-X cross-section was simulated for a first variation of the first embodiment. FIG. 6 is a cross-sectional view of the first variation of the first embodiment corresponding to the A-A cross-section in FIG. 2. As illustrated in FIG. 6, in the first variation of the first embodiment, the additional film 20 does not overlap with the resonance region 50. The width by which the additional film 20 and the resonance region 50 are separated is represented by W6. The width W6 was assumed to be 2.5 μm, and other structures and the simulation conditions were set to be the same as those of the first embodiment.

Figure 7:
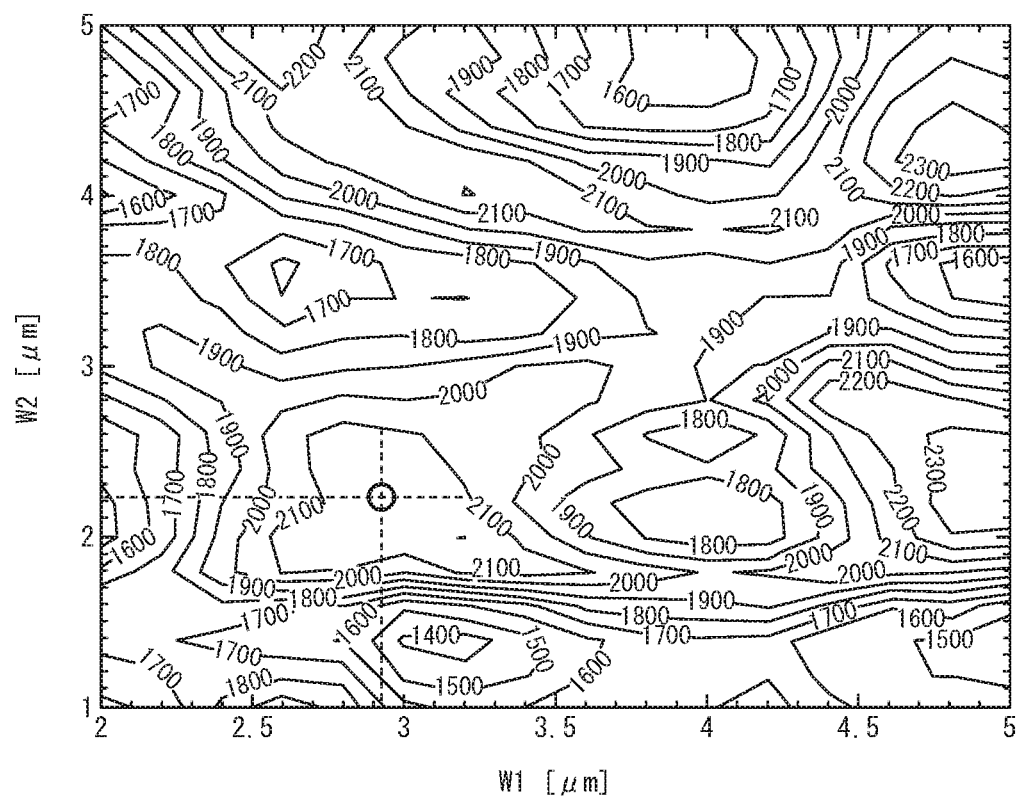
FIG. 7 illustrates the Q-value at the anti-resonant frequency with respect to the insertion widths W1 and W2 in the first variation of the first embodiment.

FIG. 7 illustrates the Q-value at the anti-resonant frequency with respect to the insertion widths W1 and W2 in the first variation of the first embodiment. The Q-value is the largest when the insertion width W1 is 2.9 μm and W2 is 2.2 μm.

As illustrated in FIG. 3A, in the extraction region 60 of the first embodiment, the acoustic wave propagating in the lateral direction is reflected by the inner end of the insertion film 28 as indicated by an arrow 70 and by the inner end of the additional film 20 as indicated by an arrow 72. It is considered that the acoustic wave leaking from the resonance region 50 to the outside is reduced when the acoustic waves indicated by the arrows 70 and 72 amplify each other. Accordingly, the Q-value is improved.

As illustrated in FIG. 3B, in the extraction region 62, the acoustic wave propagating in the lateral direction is reflected by the inner end of the insertion film 28 as indicated by the arrow 70 and by the outer end of the upper electrode 16 as indicated by an arrow 74. It is considered that the acoustic wave leaking from the resonance region 50 to the outside is reduced when the acoustic waves indicated by the arrows 70 and 74 amplify each other.

In the first variation of the first embodiment, as illustrated in FIG. 6, the additional film 20 does not overlap with the resonance region 50. Despite this structure, as illustrated in FIG. 7, the insertion widths W1 and W2 with which the Q-value is the largest differ. This is considered to be because the acoustic wave is reflected by the part where the lower electrode 12 is tapered as indicated by an arrow 76 even when the additional film 20 does not overlap with the resonance region 50 in FIG. 6.

As described above, the insertion width W1 in the extraction region 60 with which the Q-value is the largest differs from the insertion width W2 in the extraction region 62 with which the Q-value is the largest.

As illustrated in FIG. 3C, in the region 64 other than the extraction regions 60 and 62, it is considered that the acoustic wave propagating in the lateral direction is reflected by the inner end of the insertion film 28 as indicated by the arrow 70 and by the outer end of the upper electrode 16 as indicated by the arrow 74.

As illustrated in FIG. 3B and FIG. 3C, the extraction region 62 and the region 64 have substantially the same cross-section structure. Thus, it may be considered that the insertion widths W2 and W3 with which the Q-value is the largest are theoretically the same. However, in the first embodiment, the insertion widths W2 and W3 with which the Q-value is the largest are respectively 2.8 μm and 2.2 μm. The reason why the optimum insertion widths W2 and W3 differ as described above is considered to be because the Y-Y cross-section in FIG. 2 has a symmetric structure but the X-X cross-section has an asymmetric structure.

In the first variation of the first embodiment, the insertion widths W2 and W3 with which the Q-value is the largest are 2.2 μm and identical. As described above, depending on the structure of the extraction region 60, the insertion widths W2 and W3 with which the Q-value is the largest may be the same.

Second Variation of the First Embodiment

Figure 8:
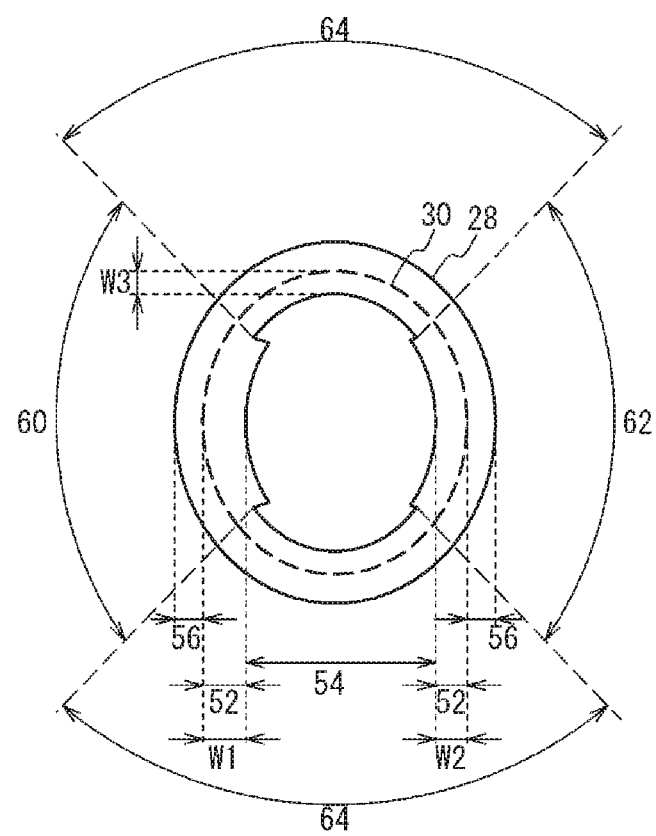
FIG. 8 is a plan view illustrating the resonance region and the insertion film in a second variation of the first embodiment.

FIG. 8 is a plan view illustrating the resonance region and the insertion film in a second variation of the first embodiment. As illustrated in FIG. 8, the resonance region 50 has an elliptical shape. The inner periphery of the insertion film 28 basically has an elliptical shape, and extends inward in the extraction regions 60 and 62. The relation among the insertion widths is W1>W2>W3. Other structures are the same as those of the first embodiment, and the description thereof is thus omitted.

In the second variation of the first embodiment, the resonance region 50 is made to have a 180 degrees rotational symmetric planar shape, and a part of the inner periphery of the insertion film 28 is offset inward in the extraction regions 60 and 62. This structure allows the insertion widths W1 through W3 to differ from each other while each of the insertion widths W1 through W3 respectively in the regions 60, 62, and 64 is substantially uniform.

Third Variation of the First Embodiment

Figure 9A:
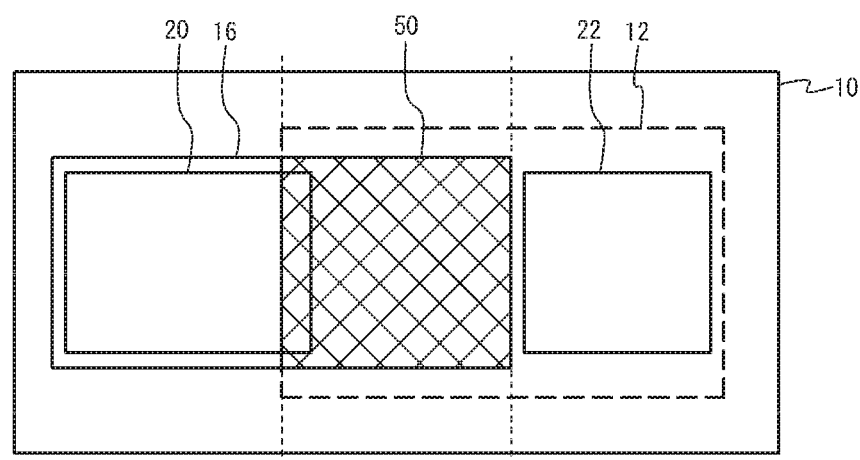
FIG. 9A is a plan view of a piezoelectric thin film resonator in accordance with a third variation of the first embodiment.
Figure 9B:
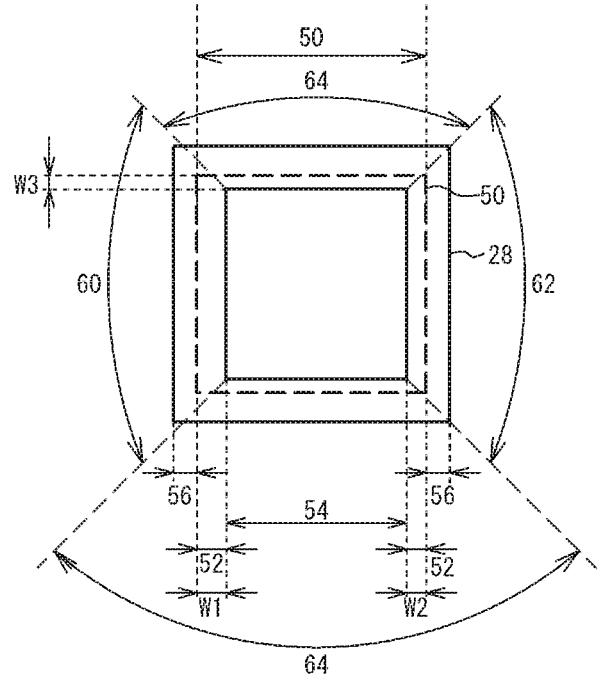
FIG. 9B is a plan view illustrating the resonance region and the insertion film.

FIG. 9A is a plan view of a piezoelectric thin film resonator in accordance with a third variation of the first embodiment, and FIG. 9B is a plan view illustrating the resonance region and the insertion film. As illustrated in FIG. 9A and FIG. 9B, the resonance region 50 has a quadrangle shape. The relation among the insertion widths W1, W2, and W3 in the extraction regions 60 and 62 and the region 64 is W1>W2>W3. Other structures are the same as those of the first embodiment, and the description thereof is thus omitted.

In the third variation of the first embodiment, the resonance region 50 has a 90 degrees rotationally symmetric planar shape (a square shape), and a part of the lower electrode 12 and a part of the upper electrode 16 are offset outward. This structure allows the insertion widths W1 through W3 to differ from each other while each of the insertion widths W1 through W3 respectively in the regions 60 and 62 and 64 is substantially uniform.

In the first embodiment and the variations thereof, the insertion width W1 (a first width) in the extraction region 60 (a first region) is greater than the insertion width W3 (a third width) in the region 64 (a third region) other than the extraction regions 60 and 62. Additionally, the insertion width W2 (a second width) in the extraction region 62 (a second region) is equal to or greater than the insertion width W3. This structure enables to optimize the Q-value as illustrated in FIG. 4, FIG. 5, and FIG. 7.

In addition, the insertion width W2 is greater than W3. This structure enables to optimize the Q-value as illustrated in FIG. 4 and FIG. 5.

Furthermore, the insertion width W1 is greater than W2. This structure enables to optimize the Q-value as described in FIG. 4 and FIG. 7.

Furthermore, the insertion width W1 in the extraction region 60 is practically uniform. The insertion width W2 in the extraction region 62 is practically uniform. The insertion width W3 in the region 64 is practically uniform. As described above, the Q-value is improved by making the insertion width practically uniform in each region. It is only required that the insertion width in each region is practically uniform to the extent that the Q-value can be optimized.

Furthermore, as illustrated in FIG. 3A, the additional film 20 is located on the upper electrode 16 in the extraction region 60. In plan view, the additional film 20 overlaps with a part of the resonance region 50. This structure makes the extraction regions 60 and 62 more asymmetric. Thus, the Q-value can be further optimized by differing the insertion width W1 from W2 and W3.

Furthermore, as illustrated in FIG. 3A, the end face 58 of the lower electrode 12 is inclined so that the lower surface of the lower electrode 12 is larger than the upper surface. This structure makes the extraction regions 60 and 62 more asymmetric. Thus, the Q-value can be further optimized by differing the insertion width W1 from W2 and W3.

As illustrated in FIG. 3A and FIG. 3B, the angle θ1 between the end face 58 of the lower electrode 12 and the lower surface of the lower electrode 12 is preferably less than the angle θ2 between the end face 59 of the upper electrode 16 and the lower surface of the upper electrode 16. This structure makes the extraction regions 60 and 62 more asymmetric. Thus, the Q-value can be further optimized by differing the insertion width W1 from W2 and W3.

Second Embodiment

Figure 10A:
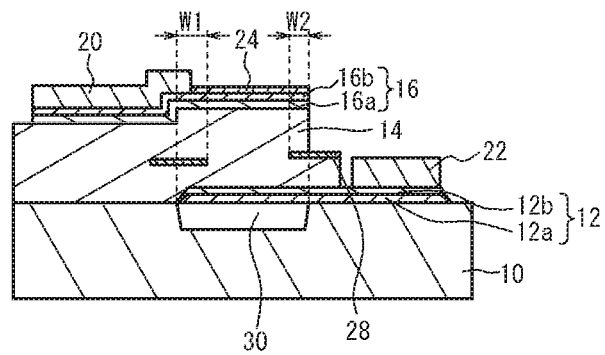
FIG. 10A is a cross-sectional view of a piezoelectric thin film resonator in accordance with a second embodiment.
Figure 10B:
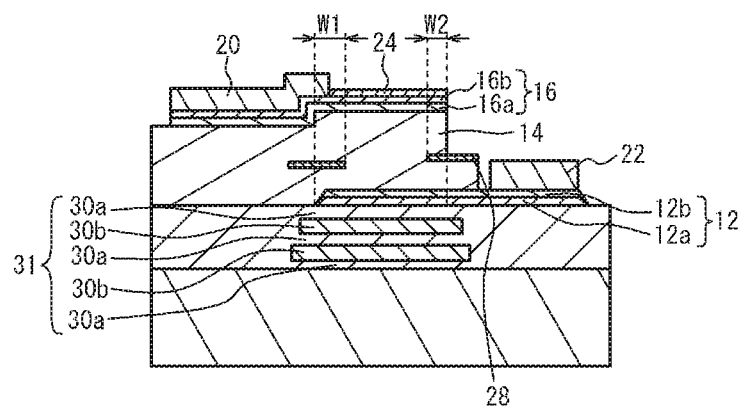
FIG. 10B is a cross-sectional view of a piezoelectric thin film resonator in accordance with a first variation of the second embodiment.

A second embodiment changes the structure of the air gap. FIG. 10A is a cross-sectional view of a piezoelectric thin film resonator in accordance with the second embodiment, and FIG. 10B is a cross-sectional view of a piezoelectric thin film resonator in accordance with a first variation of the second embodiment. As illustrated in FIG. 10A, a recess is formed on the upper surface of the substrate 10. The lower electrode 12 is flatly formed on the substrate 10. This structure forms the air gap 30 in the recess of the substrate 10. The air gap 30 is formed so as to include the resonance region 50. Other structures are the same as those of the first embodiment, and the description thereof is thus omitted. The air gap 30 may be formed so as to penetrate through the substrate 10. An insulating film may be formed so as to be in contact with the lower surface of the lower electrode 12. That is, the air gap 30 may be formed between the substrate 10 and the insulating film being in contact with the lower electrode 12. The insulating film is, for example, an aluminum nitride film.

As illustrated in FIG. 10B, an acoustic mirror 31 is formed under the lower electrode 12 in the resonance region 50. The acoustic mirror 31 includes films 30a with lows acoustic impedance and films 30b with high acoustic impedance that are alternately stacked. The film thickness of each of the films 30a and 30b is, for example, λ/4 (λ, is the wavelength of the acoustic wave). The number of the films 30a and 30b that are stacked is freely selected. It is only required that the acoustic mirror 31 includes two layers with different acoustic characteristics stacked at an interval. Alternatively, the substrate 10 may be one of the two layers with different acoustic characteristics of the acoustic mirror 31. For example, the acoustic mirror 31 may have a structure in which a single layer film with acoustic impedance different from that of the substrate 10 is located in the substrate 10. Other structures are the same as those of the first embodiment, and the description thereof is thus omitted.

In the first embodiment and the variations thereof, the air gap 30 may be formed in the same manner as in the second embodiment, or the acoustic mirror 31 may be formed instead of the air gap 30 as in the first variation of the second embodiment.

As in the first embodiment and the variations thereof and the second embodiment, the piezoelectric thin film resonator may be a film bulk acoustic resonator (FBAR) in which the air gap 30 is formed between the substrate 10 and the lower electrode 12 in the resonance region 50. Alternatively, as in the first variation of the second embodiment, the piezoelectric thin film resonator may be a solidly mounted resonator (SMR) including the acoustic mirror 31 reflecting the acoustic wave propagating through the piezoelectric film 14 under the lower electrode 12 in the resonance region 50.

In the first and second embodiments and the variations thereof, it is only required that the insertion film 28 is located at a part of the outer peripheral region of the resonance region 50. Alternatively, the insertion film 28 may be located between the lower electrode 12 and the piezoelectric film 14 or between the piezoelectric film 14 and the upper electrode 16. The example in which the resonance region 50 has an elliptical shape or a square shape is described, but the resonance region 50 has other shape. For example, the resonance region 50 has a quadrangle shape other than a square shape or a polygonal shape such as a pentagonal shape.

Third Embodiment

Figure 11:
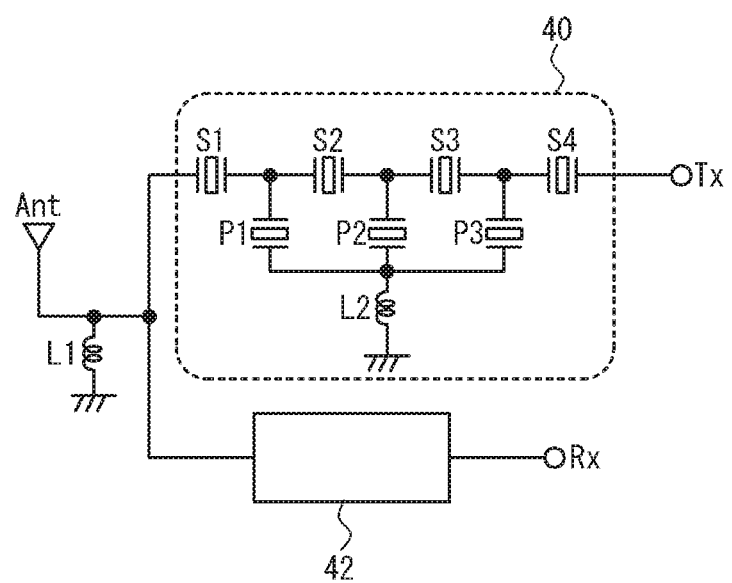
FIG. 11 is a circuit diagram of a duplexer in accordance with a third embodiment.

A third embodiment is an exemplary duplexer. FIG. 11 is a circuit diagram of a duplexer in accordance with the third embodiment. As illustrated in FIG. 11, the duplexer includes a transmit filter 40 and a receive filter 42. The transmit filter 40 is connected between a common terminal Ant and a transmit terminal Tx. The receive filter 42 is connected between the common terminal Ant and a receive terminal Rx. An inductor L1 as a matching circuit is located between the common terminal Ant and ground. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. The inductor L1 matches impedance so that the transmission signal passing through the transmit filter 40 is output from the common terminal Ant without leaking to the receive filter 42.

The transmit filter 40 is a ladder-type filter. One or more series resonators S1 through S4 are connected in series between the transmit terminal Tx (an input terminal) and the common terminal Ant (an output terminal). One or more parallel resonators P1 through P3 are connected in series between the transmit terminal Tx and the common terminal Ant. The ground side terminals of the parallel resonators P1 through P3 are commonly grounded through an inductor L2. The number and connection of the series resonators, the parallel resonators, and the inductors may be appropriately changed to achieve desired transmit filter characteristics. At least one of the series resonators S1 through S4 and the parallel resonators P1 through P3 may be the piezoelectric thin film resonator according to any one of the first and second embodiments and the variations thereof.

Figure 12A:
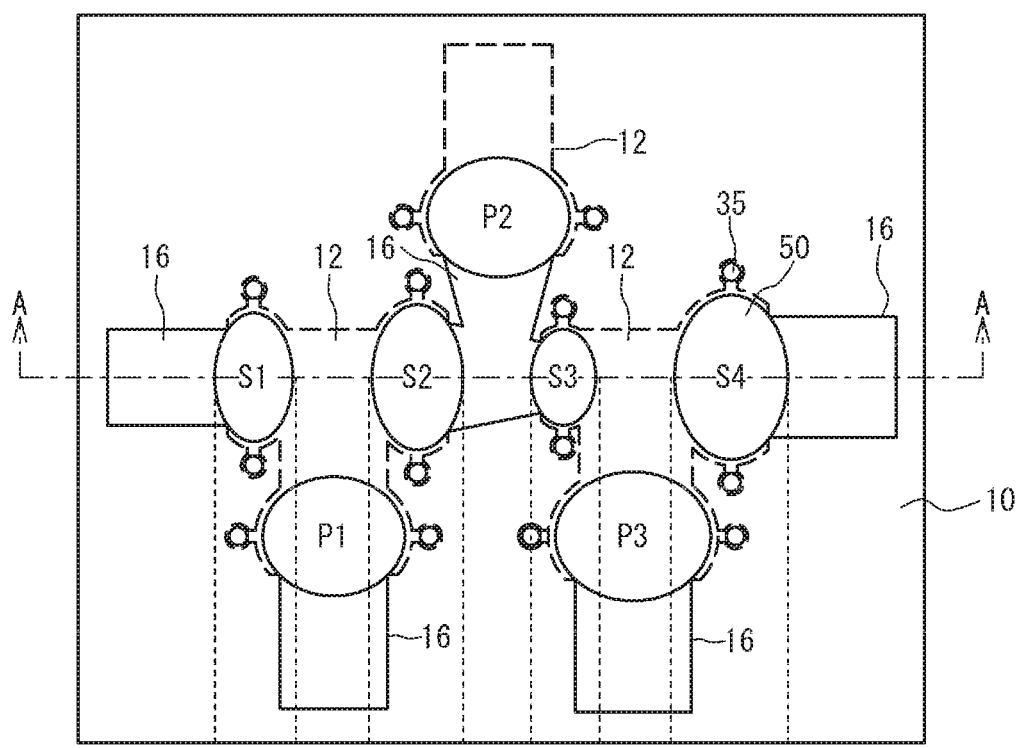
FIG. 12A is a plan view of a transmit filter.
Figure 12B:
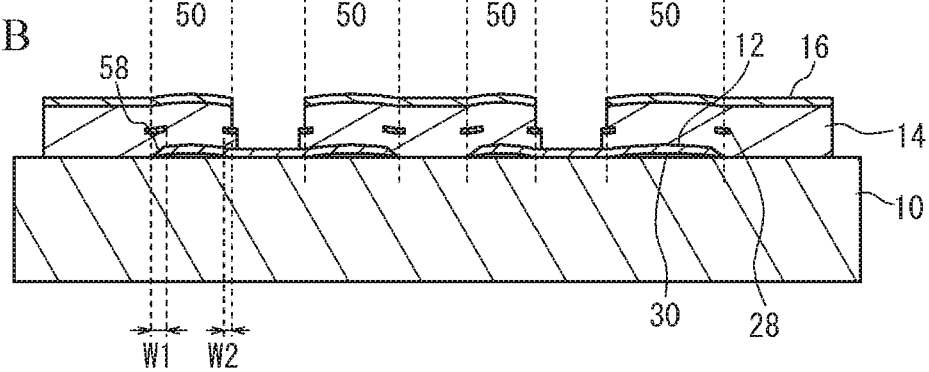
FIG. 12B is a cross-sectional view taken along line A-A in FIG. 12A.

FIG. 12A is a plan view of the transmit filter, and FIG. 12B is a cross-sectional view taken along line A-A in FIG. 12A. As illustrated in FIG. 12A and FIG. 12B, the piezoelectric thin film resonators of the first and second embodiments and the variations thereof are formed on the same substrate 10 to form a ladder-type filter. The insertion width W1 is greater than W2. Although not illustrated, the insertion width W3 is less than W1 and W2. Other structures are the same as those of the first embodiment, and the description thereof is thus omitted. The size and the shape of the resonance region 50 of each of the resonators S1 through S4 and P1 through P3 can be appropriately changed.

The receive filter 42 may be a ladder-type filter or a multimode filter. At least one of the transmit filter 40 and the receive filter 42 can be a ladder-type filter or a lattice-type filter. Additionally, at least one resonator of at least one of the transmit filter 40 and the receive filter 42 can be the piezoelectric thin film resonator according to any one of the first and second embodiments and the variations thereof. This configuration reduces the loss of the filter and/or the duplexer. A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a piezoelectric film located on the substrate;
   a lower electrode and an upper electrode facing each other across at least a part of the piezoelectric film; and
   an insertion film that is located between the lower electrode and the upper electrode, is located in at least a part of a region surrounding a center region of a resonance region defined by a region where the lower electrode and the upper electrode face each other across the piezoelectric film, overlaps with an outer circumference of the resonance region, is located along the outer circumference, and is not located in a center region of the resonance region, a first width in the resonance region of the insertion film in a first region being greater than a third width in the resonance region in a third region, a second width in the resonance region in a second region being equal to or greater than the third width, the first region being defined by a region where the upper electrode being extracted from the resonance region, the third region being a region other than the second region and the first region, the second region being defined by a region where the lower electrode being extracted from the resonance region, the first width in the first region being a width perpendicular to the outer circumference, being greater than 0 and being substantially uniform, the second width in the second region being a width perpendicular to the outer circumference, being greater than 0 and being substantially uniform, the third width in the third region being a width perpendicular to the outer circumference, being greater than 0 and being substantially uniform.

2. The piezoelectric thin film resonator according to claim 1, wherein
   the second width is greater than the third width.

3. The piezoelectric thin film resonator according to claim 1, wherein
   the first width is greater than the second width.

4. The piezoelectric thin film resonator according to claim 1, further comprising:
   an additional film located on the upper electrode in the first region.

5. The piezoelectric thin film resonator according to claim 4, wherein
   the additional film overlaps with a part of the resonance region in plan view.

6. The piezoelectric thin film resonator according to claim 1, wherein
   an end face of the lower electrode is inclined so that a lower surface of the lower electrode is larger than an upper surface of the lower electrode.

7. The piezoelectric thin film resonator according to claim 1, wherein
   the insertion film has Young's modulus less than Young's modulus of the piezoelectric film.

8. The piezoelectric thin film resonator according to claim 1, wherein
   an air layer is located under the lower electrode in the resonance region.

9. The piezoelectric thin film resonator according to claim 1, wherein
   an acoustic mirror reflecting an acoustic wave propagating through the piezoelectric film is located under the lower electrode in the resonance region.

10. The piezoelectric thin film resonator according to claim 1, wherein
    an angle between an end face of the upper electrode and a lower surface of the upper electrode in the second region is greater than an angle between an end face of the lower electrode and a lower surface of the lower electrode in the first region.

11. The piezoelectric thin film resonator according to claim 1, wherein
    the lower electrode is located from inside the resonance region to outside the resonance region in the third region,
    the piezoelectric film includes a lower piezoelectric film and an upper piezoelectric film located on the lower piezoelectric film,
    the insertion film is located between the lower piezoelectric film and the upper piezoelectric film,
    an end face of the upper piezoelectric film substantially coincides with an end face of the upper electrode in the second region and the third region in plan view, and
    an end face of the lower piezoelectric film is located further out than the end face of the upper piezoelectric film and overlaps with the lower electrode in the second region and the third region in plan view.

12. The piezoelectric thin film resonator according to claim 2, further comprising an additional film only located on the upper electrode in the first region among the resonance region.

13. A filter comprising:
    a piezoelectric thin film resonator including:
      a substrate;
      a piezoelectric film located on the substrate;
      a lower electrode and an upper electrode facing each other across at least a part of the piezoelectric film; and
      an insertion film that is located between the lower electrode and the upper electrode, is located in at least a part of a region surrounding a center region of a resonance region defined by a region where the lower electrode and the upper electrode face each other across the piezoelectric film, overlaps with an outer circumference of the resonance region, is located along the outer circumference, and is not located in a center region of the resonance region, a first width in the resonance region of the insertion film in a first region being greater than a third width in the resonance region in a third region, a second width in the resonance region in a second region being equal to or greater than the third width, the first region being defined by a region where the upper electrode being extracted from the resonance region, the third region being a region other than the second region and the first region, the second region being defined by a region where the lower electrode being extracted from the resonance region, the first width in the first region being a width perpendicular to the outer circumference, being greater than 0 and being substantially uniform, the second width in the second region being a width perpendicular to the outer circumference, being greater than 0 and being substantially uniform, the third width in the third region being a width perpendicular to the outer circumference, being greater than 0 and being substantially uniform.

14. A multiplexer comprising:
a filter including a piezoelectric thin film resonator, wherein
the piezoelectric thin film resonator including:
  a substrate;
  a piezoelectric film located on the substrate;
  a lower electrode and an upper electrode facing each other across at least a part of the piezoelectric film; and
  an insertion film that is located between the lower electrode and the upper electrode, is located in at least a part of a region surrounding a center region of a resonance region defined by a region where the lower electrode and the upper electrode face each other across the piezoelectric film, overlaps with an outer circumference of the resonance region, is located along the outer circumference, and is not located in a center region of the resonance region, a first width in the resonance region of the insertion film in a first region being greater than a third width in the resonance region in a third region, a second width in the resonance region in a second region being equal to or greater than the third width, the first region being defined by a region where the upper electrode being extracted from the resonance region, the third region being a region other than the second region and the first region, the second region being defined by a region where the lower electrode being extracted from the resonance region, the first width in the first region being a width perpendicular to the outer circumference, being greater than 0 and being substantially uniform, the second width in the second region being a width perpendicular to the outer circumference, being greater than 0 and being substantially uniform, the third width in the third region being a width perpendicular to the outer circumference, being greater than 0 and being substantially uniform.

* * * * *